(12) United States Patent
Nakata et al.

(10) Patent No.: US 7,542,255 B2
(45) Date of Patent: Jun. 2, 2009

(54) INPUT PROTECTION CIRCUIT

(75) Inventors: Shinichiro Nakata, Takahama (JP);
Hiroyuki Ban, Hazu-gun (JP); Satoshi Ichikawa, Gamagori (JP)

(73) Assignee: DENSO CORPORATION, Kariya (JP)

( * ) Notice: Subject to any disclaimer, the term of this patent is extended or adjusted under 35 U.S.C. 154(b) by 102 days.

(21) Appl. No.: 11/715,421

(22) Filed: Mar. 8, 2007

(65) Prior Publication Data

US 2007/0217104 A1     Sep. 20, 2007

(30) Foreign Application Priority Data

Mar. 16, 2006   (JP)   ............................. 2006-072545
Mar. 17, 2006   (JP)   ............................. 2006-074608

(51) Int. Cl.
*H02H 3/22* (2006.01)

(52) U.S. Cl. .......................................... 361/56; 361/111

(58) Field of Classification Search .................. 361/56, 361/91.1, 111; 257/355–360
See application file for complete search history.

(56) References Cited

U.S. PATENT DOCUMENTS 6,385,021 B1     5/2002  Takeda et al.
2004/0021178 A1*  2/2004  Larson ........................ 257/355

FOREIGN PATENT DOCUMENTS

JP     A-5-160348     6/1993

* cited by examiner

*Primary Examiner*—Stephen W Jackson
*Assistant Examiner*—Danny Nguyen
(74) *Attorney, Agent, or Firm*—Posz Law Group, PLC

(57) ABSTRACT

An input protection circuit comprises a reverse flow preventing diode, a series circuit of a diode and a Zener diode, and a current path forming resistor or diode. The reverse flow preventing diode is connected between an input terminal and an internal circuit. The series circuit is connected between the input terminal and a ground. The current path forming resistor or diode is connected between a first common connection point of the reverse flow preventing diode and the internal circuit and a second common connection point of the series circuit, and sets a potential at the first common connection point to be less than a potential at the input terminal when the surge voltage is applied to the input terminal.

21 Claims, 14 Drawing Sheets

INPUT PROTECTION CIRCUIT

CROSS REFERENCE TO RELATED APPLICATION

This application is based on and incorporates herein by reference Japanese Patent Applications No. 2006-072545 filed on Mar. 16, 2006 and No. 2006-074608 filed on Mar. 17, 2006.

FIELD OF THE INVENTION

The present invention relates to an input protection circuit that protects internal circuits when a surge voltage is applied to an input terminal.

BACKGROUND OF THE INVENTION

JP 5-160348A discloses a conventional input protection circuit that protects internal circuits from destruction when a surge voltage is applied to an input terminal of a semiconductor integrated circuit. In this circuit, as shown in FIG. 13, an input terminal 1 is connected to a positive terminal of a comparator 3, which is an internal circuit, via a resistor 2, and to the collector of an NPN transistor, which is also and internal circuit, via a diode 4.

The emitter of the transistor 5 is connected to the ground, and the base is connected to other internal circuits (not shown). A negative terminal and an output terminal of the comparator 3 are also connected to other internal circuits (not shown), respectively. The diode 4 is disposed to prevent reverse flow of current to the input terminal 1 from the ground via the transistor 5 when a ground potential rises for some reason.

Between the input terminal 1 and the ground, a series circuit of a diode 6 in a forward-biased direction and a Zener diode 7 in a reverse-biased direction, and a series circuit of a diode 8 in a reverse-biased direction and a Zener diode 9 in a forward-biased direction are connected. That is, an input protection circuit 10 is constructed with diodes 6 to 9, and forms a semiconductor integrated circuit 11 together with other internal circuits.

When a surge voltage of positive polarity is applied to the input terminal 1, and a corresponding voltage applied to the Zener diode 7 exceeds a Zener voltage VZ, the Zener diode 7 breaks down and becomes conductive. Then, since a current flows from the input terminal 1 to the ground via the diode 6 and the Zener diode 7, a potential at the input terminal 1 is clamped to (VZ+Vf). Vf is a forward voltage of the diode 6. As a result, the comparator 3 and the transistor 5 can be protected from the surge voltage.

The above protection operation is desirable, as long as the diode 4 for the reverse flow prevention and the transistor 5 are both OFF. However, actually, for example, if an extremely high level of surge voltage of about 100V is applied to the input terminal 1, the diode 4 might turn on momentarily due to current leak or the like. In this case, the collector of the transistor 5 has substantially the same potential as at the input terminal 1. When the surge voltage exceeds an OFF withstand voltage Vceo, the transistor 5 would be broken down. The above problem also occurs likewise when, for example, a resistor for limiting an input current is disposed in place of the diode 4.

U.S. Pat. No. 6,385,021 discloses another conventional input protection circuit. In this circuit, as denoted with numeral 112 in FIG. 23, input terminals 101 and 102 of a semiconductor integrated circuit are connected to internal circuits 103 and 104, respectively. The internal circuits 103 and 104 are a transistor, an operational amplifier, or a comparator, for example. The input terminal 101 is connected to the anode of a diode 105 and the cathode of a diode 107. The input terminal 102 is connected to the anode of a diode 106 and the cathode of a diode 108.

The anodes of diodes 107 and 108 are connected to the circuit ground, and the cathodes of the diodes 105 and 106 are connected to the circuit ground via the drain and the source of an N-channel LD (lateral diffused) MOSFET 109. A Zener diode 110 is connected between the drain and the gate of FET 109, and a resistor 111 is connected between the gate and the source of FET 109.

A surge voltage of positive polarity may be applied to the input terminal 101 or 102. When a corresponding voltage applied to the Zener diode 110 exceeds a Zener voltage VZ, the Zener diode 110 becomes conductive, a terminal voltage develops in the resistor 111, and the FET 109 turns on. Then, since a surge current flows into the circuit ground via the FET 109 from the input terminal 101 or 102, the internal circuit 103 or 104 can be protected.

According to the input protection circuit 112, although protection operation is possible for application of a surge voltage of positive polarity, protection is impossible when a surge voltage of negative polarity such as field decay is applied in an IC such as an electronic control unit (ECU) mounted in a vehicle. The input protection circuit 112 may be modified as shown in FIG. 24 to protect the internal circuits from surge voltages of negative polarity. In FIG. 24, although showing a case of only one input terminal 101, an N-channel LDMOSFET 113 is connected between the circuit ground and the anode of the diode 107, and a Zener diode 114 and a resistor 115 are connected between the drain and the gate of an FET 113, and between the gate and the source of the same, respectively.

However, when the entire circuit is integrated into a single semiconductor integrated circuit chip (IC), if each circuit element is formed by PN junction isolation, a parasitic diode 107a is formed in the diode 107 for reverse flow prevention between terminals as shown in FIG. 25. Therefore, when a surge voltage (e.g., about −100 V) of negative polarity is applied to the input terminal 101, a surge current flows from the ground via the parasitic diode 107a. As a result, the FET 113 of the input protection circuit does not turn on.

In this case, since the parasitic diode 107a cannot withstand such a large current, it may be thermally broken down. Because of such circumstances, it is conventionally not easy to integrate electronic circuits including the protection circuit into an IC. As a result, external discrete elements are used as a protection countermeasure. Thus, the entire circuit becomes large and increases costs.

SUMMARY OF THE INVENTION

It is therefore an object of the present invention to provide an input protection circuit that surely protects internal circuits from a surge voltage even when an impedance element is provided between an input terminal and the internal circuit.

According to one aspect of the present invention, an input protection circuit comprises a reverse flow preventing element, a series circuit and a current path forming element. The reverse flow preventing element is connected between an input terminal that receives a signal from an outside and an internal circuit. The series circuit is connected between the input terminal and a ground and includes a voltage generating element that develops a voltage thereacross when conductive and a voltage clamp element that clamps the voltage when a surge voltage is applied to the input terminal. The current path forming element forms a current path between a first common connection point of the reverse flow preventing element and the internal circuit and a second common connection point of the series circuit, and sets a potential at the first common connection point to be less than a potential at the input terminal when the surge voltage is applied to the input terminal. The current path forming element may be a transistor, and the current path forming element may be a diode.

According to another aspect of the present invention, an input protection circuit comprises an impedance element, a series circuit and a current path forming element. The impedance element is connected between an input terminal that receives a signal from an outside and an internal circuit. The series circuit is connected between the input terminal and a ground and includes a voltage generating element that develops a voltage thereacross when conductive and a voltage clamp element that clamps the voltage when a surge voltage is applied to the input terminal. The current path forming element forms a unidirectional current path between a first common connection point of the impedance element and the internal circuit and a second common connection point of the series circuit, and sets a potential at the first common connection point to be less than a potential at the input terminal when the surge voltage is applied to the input terminal. A resistor may be connected between the impedance element and the current path forming element. The voltage clamp element may include a Zener diode, and the voltage generating element may include a diode.

According to a further aspect of the present invention, an input protection circuit comprises a first diode, a second diode, a first clamping circuit and a second clamping circuit. The first diode has an anode and a cathode, the anode being connected to an input terminal that transmits a signal received from an outside to an internal circuit. The second diode has an anode and a cathode, the cathode being connected to the input terminal. The first clamping circuit is connected between the cathode of the first diode and a circuit ground. The second clamping circuit is connected between the anode of the second diode and the circuit ground. Each circuit element such as the second diode is formed within a region mutually insulated from adjacent formation regions of other circuit elements. The second diode may be formed within the region that is trench-isolated by an insulating film on a silicon-on-insulator substrate.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE EMBODIMENTS

The present invention will be described in detail with reference to various embodiments.

First Embodiment

Figure 1:
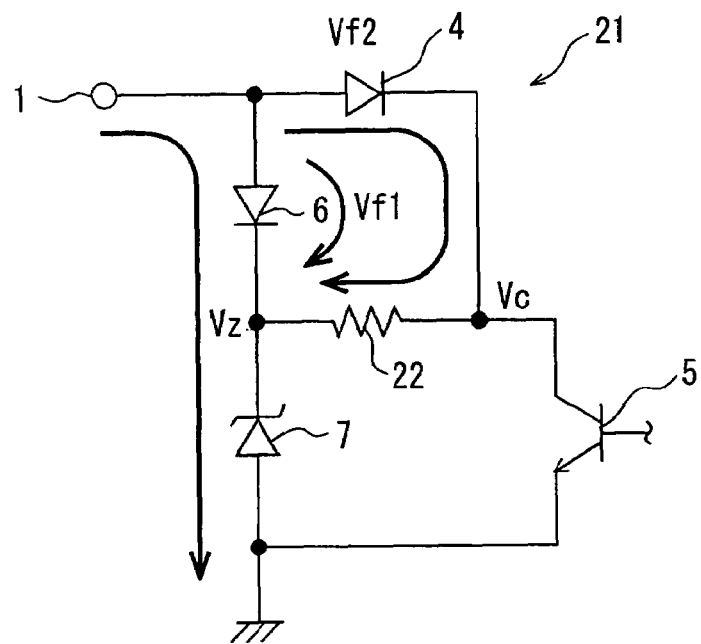
FIG. 1 is a circuit diagram showing an input protection circuit of a first embodiment of the present invention.
Figure 13:
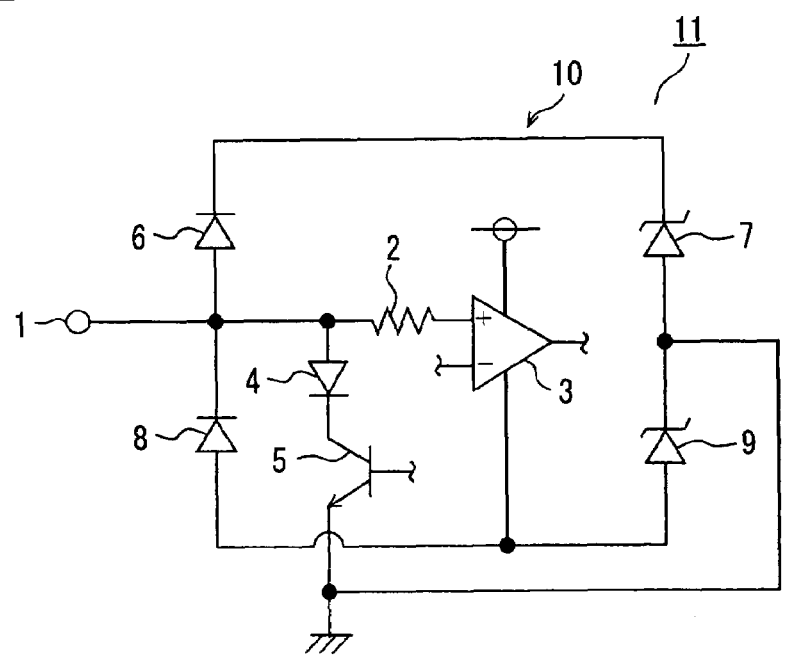
FIG. 13 is a circuit diagram showing a conventional input protection circuit.

Referring first to FIG. 1, in which the same reference numerals designate the same or similar portions as those of FIG. 13, an input protection circuit 21 has a resistor 22 (current path forming element) connected between the collector of a transistor 5 and the cathode of a Zener diode 7 (voltage clamp element).

When a surge voltage of positive polarity is applied to an input terminal 1, initially, a current flows via a diode 6 (voltage generating element) and the Zener diode 7. At this time, the anode (second common connection point) of the Zener diode 7 has a Zener voltage VZ, and clamps the surge voltage to about 60 to 70V. Since a very large current flows through the diode 6, a forward voltage Vf1 has a value corresponding to the current.

When the forward voltage Vf1 develops in the diode 6, a current flows with a slight time delay along a path of a diode 4 (reverse flow prevention element) and the resistor 22. As a result, the potential Vc of the collector (first common connection point) of the transistor 5 is determined by dividing the forward voltage Vf1 by a forward voltage Vf2 of the diode 4 and a terminal voltage VR of the resistor 22 with the Zener voltage VZ as reference. Therefore, the relationship of Vf1>Vf2 is established.

As a result of the above operation, the collector potential Vc is determined as follows.

$$Vc=VZ+VR=VZ+Vf1-Vf2$$

Since the potential at the input terminal 1 is (VZ+Vf1), the collector potential Vc is set to less than the potential at the input terminal 1.

The diode 4 is disposed to prevent a current from flowing in reverse from the Zener diode 7 to the input terminal 1 via the resistor 22 when the ground potential rises.

With the resistor 22 being connected between the collector of the transistor 5 and the cathode of the Zener diode 7, when a surge voltage of positive polarity is applied to the input terminal 1 of the semiconductor integrated circuit, a path for allowing a current to flow via the resistor 22 is formed, and the potential Vc of the collector is set to be less than the potential at the input terminal 1. Therefore, a voltage applied directly to the transistor 5 never fails to be reduced, and the transistor 5 can be prevented from being broken down. The clamp of surge voltages can be adjusted by the Zener voltage VZ of the Zener diode 7.

In a region in which a very large current flows through the diodes 4 and 6 as a result of the application of a surge voltage, forward voltages of the diodes 4 and 6 rise substantially in proportion to the current, and the diodes 4 and 6 appear to have the same effect as a resistor. Therefore, a voltage applied to the transistor 5 can be reduced by the voltages that develop across the diode 4.

Second Embodiment

Figure 2:
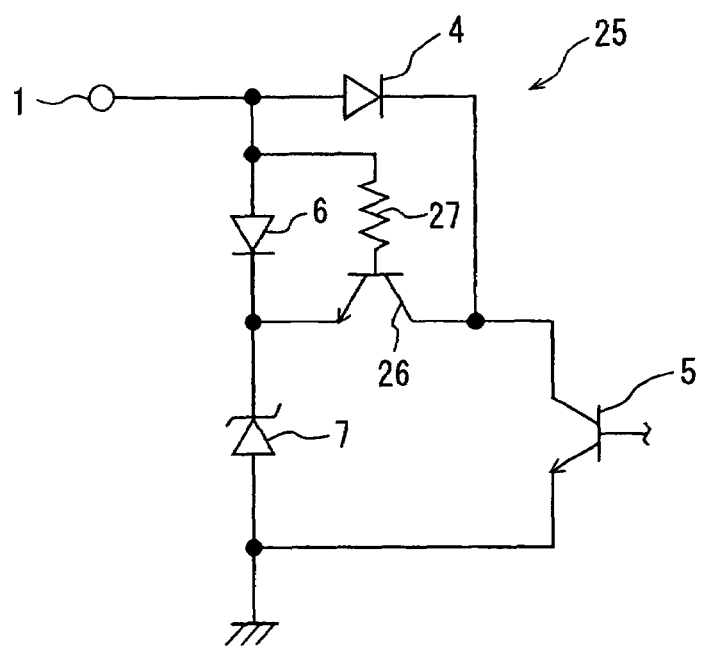
FIG. 2 is a circuit diagram showing an input protection circuit of a second embodiment of the present invention.

In a second embodiment, as shown in FIG. 2, an input protection circuit 25 has an NPN transistor 26 (current path forming element) in place of the resistor 22 of the input protection circuit 21. That is, the collector of the transistor 26 is connected to the collector of the transistor 5, the emitter of the same is connected to the cathode of the Zener diode 7, and the base of the transistor 26 is connected to the input terminal 1 via a base resistor 27.

Since the transistor 26 is turned on when a surge voltage is applied to the input terminal 1, the potential Vc of the collector of the transistor 5 can be set to substantially the same potential as the Zener voltage VZ.

Third Embodiment

Figure 3:
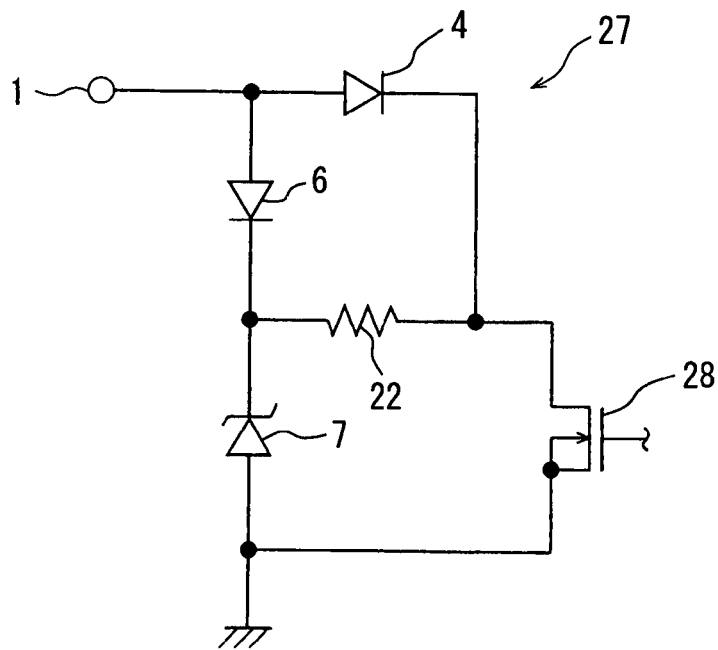
FIG. 3 is a circuit diagram showing an input protection circuit of a third embodiment of the present invention.

In a third embodiment shown in FIG. 3, an input protection circuit 27 has an N-channel MOSFET 28 (internal circuit) in place of the transistor 5 of the input protection circuit 21. This embodiment provides the same effect as the first embodiment.

Fourth Embodiment

Figure 4:
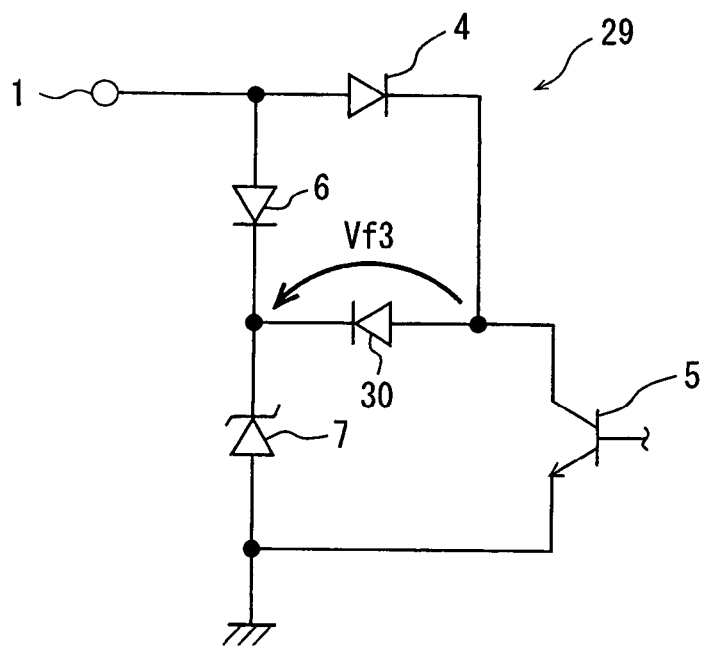
FIG. 4 is a circuit diagram showing an input protection circuit of a fourth embodiment of the present invention.
Figure 5:
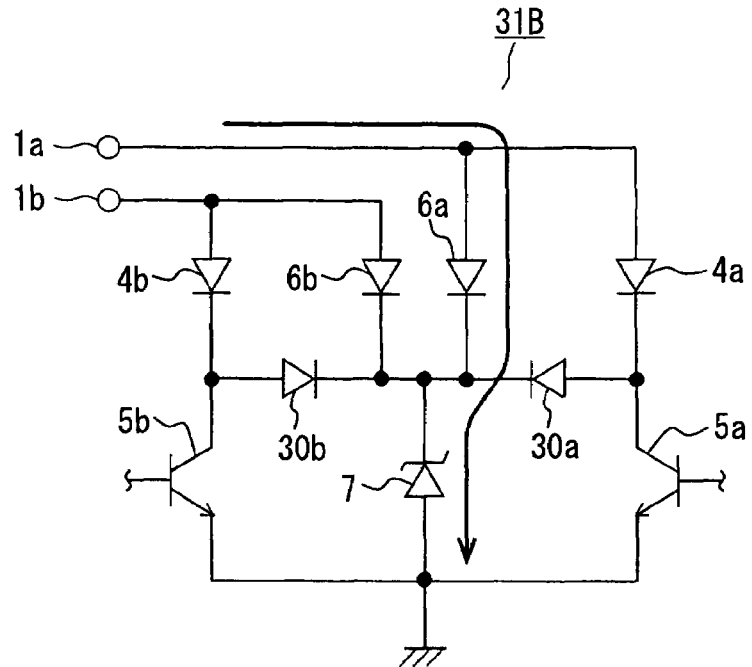
FIG. 5 is a circuit diagram showing an application of an input protection circuit provided for plural input terminals.
Figure 6:
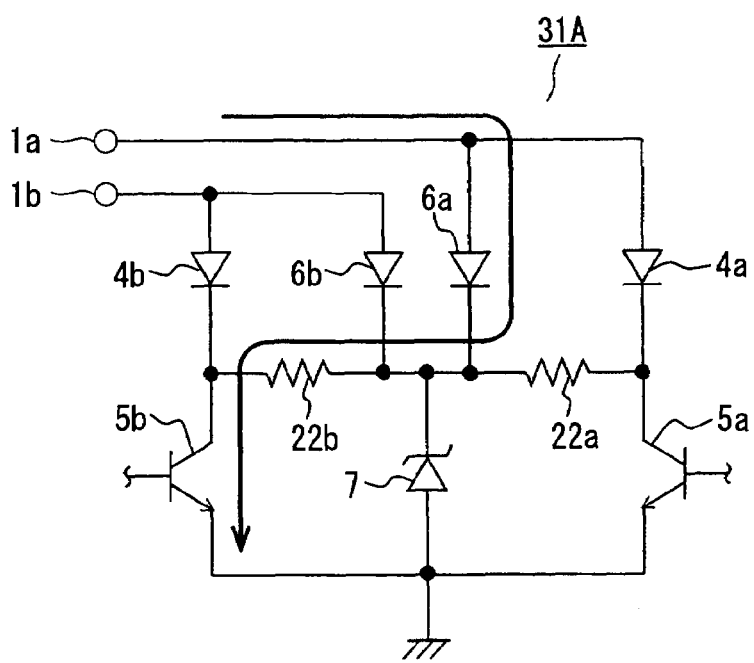
FIG. 6 is a circuit diagram showing an application of the input protection circuit of the third embodiment.

In a fourth embodiment shown in FIGS. 4 to 6, an input protection circuit 29 has a diode 30 (current path forming element) in place of the resistor 22 of the input protection circuit 21. Like the first embodiment, when a surge voltage is applied to the input terminal 1, and a large forward voltage Vf1 is developed in the diode 6, a current flows into the path of the diodes 4 (impedance component) and 30, and forward voltages Vf2 and Vf3 are developed. As a result, the potential Vc of the collector of the transistor 5 has a voltage of (VZ+Vf3).

The input protection circuit 29 provides the following effects. FIG. 6 shows a construction in which the input protection circuit 21 of the first embodiment is applied when a semiconductor integrated circuit 31A has plural input terminals (1a and 1b). The Zener diode 7 is provided in common for both terminals 1a and 1b, and other elements are connected in parallel.

It is assumed that a transistor 5a is OFF and a transistor 5b is ON, and a surge voltage is applied to the input terminal 1a. Since a surge current flows into the ground via the input terminal 1a, a diode 6a, a resistor 22b, and the transistor 5b as indicate with a solid arrow line, voltage clamp by the Zener diode 7 would not function.

On the other hand, if the input protection circuit 29 is applied to a semiconductor integrated circuit 31B having plural input terminals as shown in FIG. 5. In this case, since a current is blocked by the diode 30b not to flow into the transistor 5b, a surge current flows via the Zener diode 7. Thus, voltage clamp is attained.

According to the fourth embodiment, the diode 30 forms a current flow path. If a surge voltage is applied to the input terminal 1a when the transistor 5b is ON, a surge current that is to flow into the transistor 5b can be blocked by the reverse-biased diode 30b. Moreover, the potential Vc of the collector of the transistor 5 can be limited to (VZ+Vf3).

Fifth Embodiment

Figure 7:
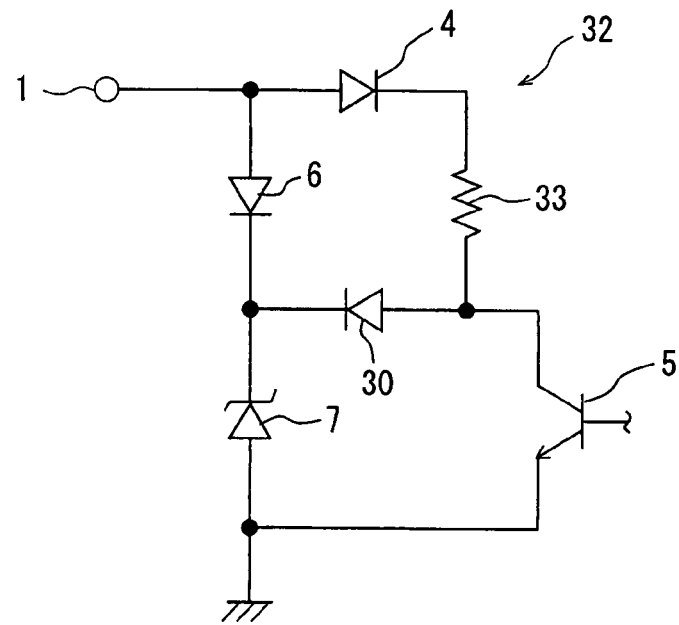
FIG. 7 is a circuit diagram showing an input protection circuit of a fifth embodiment of the present invention.

In a fifth embodiment shown in FIG. 7, an input protection circuit 32 has a resistor 33 connected between the collector of the transistor 5 and the diode 4. When a surge voltage is applied to the input terminal 1, voltages applied to the collector of the transistor 5 can be limited by the resistor 33.

Sixth Embodiment

Figure 8:
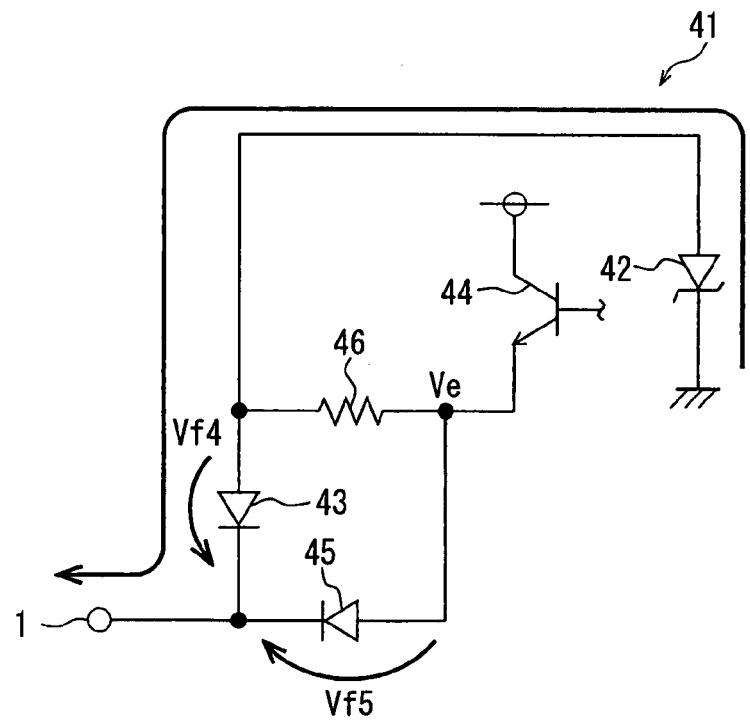
FIG. 8 is a circuit diagram showing an input protection circuit of a sixth embodiment of the present invention.

In a sixth embodiment shown in FIG. 8, the first embodiment is modified to protect internal circuits against surge voltages of negative polarity. Specifically, in an input protection circuit 41, a series circuit of a Zener diode 42 (voltage clamp element) and a diode 43 (voltage generating element) is connected between a circuit ground and the input terminal 1. The collector of an NPN transistor 44 as an internal circuit is connected to a power supply and its emitter is connected to the input terminal 1 via a diode 45 (reverse flow preventing element). A resistor 46 (current path forming element) is connected between the collector (first common connection point) of the transistor 44 and the anode (second common connection point) of the diode 43.

When a surge voltage of negative polarity is applied to the input terminal 1, initially, a current flows from the circuit ground via the Zener diode 42 and the diode 43. At this time, the anode of the Zener diode 42 has a voltage of −VZ relative to a ground potential and clamps the surge voltage to −VZ. A very large current flows through the diode 43, a forward voltage Vf4 has a value corresponding to the current, and the potential at the input terminal 1 has a voltage of −(VZ+Vf4).

When the forward voltage Vf4 develops in the diode 43, a current flows with a slight time delay along a path of the resistor 46 and the diode 45. As a result, the potential Ve of the emitter of the transistor 44 has a potential determined by dividing the forward voltage Vf4 by a terminal voltage VR of the resistor 46 and a forward voltage Vf5 of the diode 45 with the anode potential (−VZ) of the diode 43 as reference. Therefore, the relationship of Vf4>Vf5 is established. As a result, the emitter potential Ve is determined as follows.

$$Ve=-VZ-VR=-VZ-Vf4+Vf5$$

Since the potential at the input terminal 1 is −(VZ+Vf4), the emitter potential Ve is set to be less than the potential at the input terminal 1 (absolute value comparison).

According to the seventh embodiment, when a surge voltage of negative polarity is applied to the input terminal 1, the same effect as the first embodiment can be provided.

Seventh to Ninth Embodiments

Figure 9:
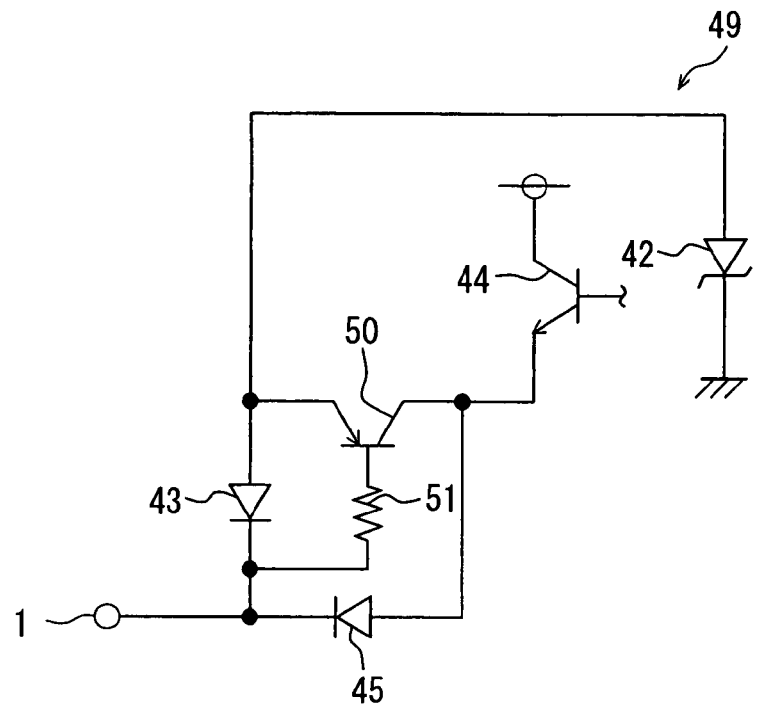
FIG. 9 is a circuit diagram showing an input protection circuit of a seventh embodiment of the present invention.
Figure 10:
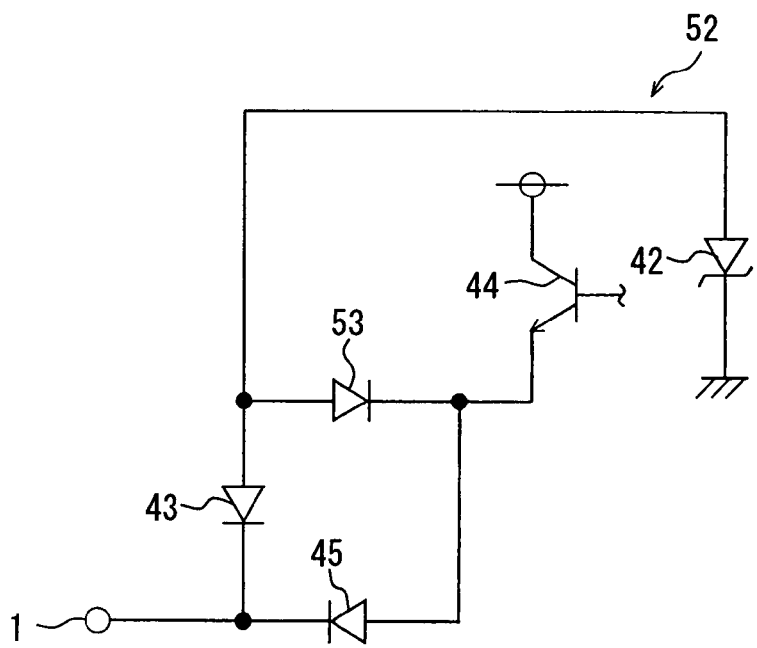
FIG. 10 is a circuit diagram showing an input protection circuit of an eighth embodiment of the present invention.
Figure 11:
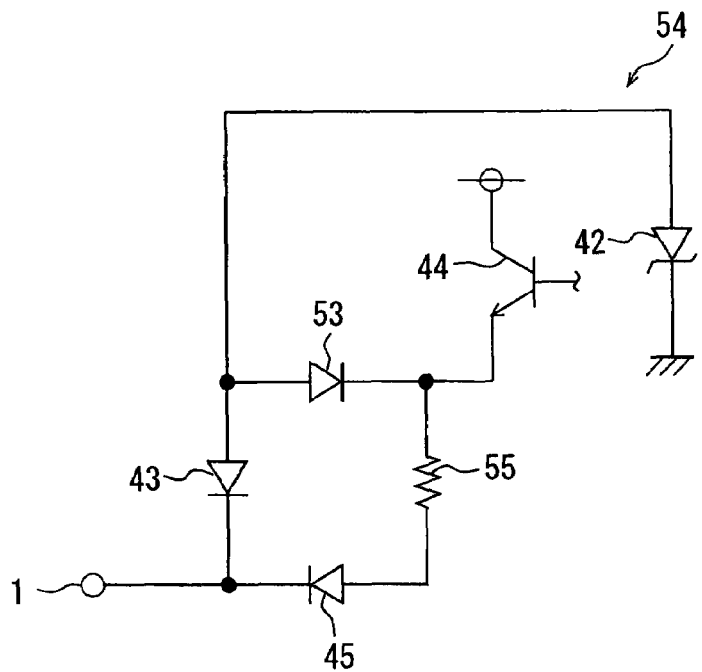
FIG. 11 is a circuit diagram showing an input protection circuit of a ninth embodiment of the present invention.

Seventh to ninth embodiments shown in FIGS. 9 to 11 are modifications of the second, fourth, and fifth embodiments to protect internal circuits against surge voltages of negative polarity.

Specifically, an input protection circuit 49 of the seventh embodiment shown in FIG. 9 has a PNP transistor 50 (current path forming element) in place of the resistor 46 of the sixth embodiment. The emitter of the transistor 50 is connected to the anode of the diode 43, its collector is connected to the emitter of the transistor 44, and its base is connected to the input terminal 1 via a resistor 51.

An input protection circuit 52 of the eighth embodiment shown in FIG. 10 has a diode 53 (current path forming element) in place of the resistor 46 of the sixth embodiment.

An input protection circuit 54 of the ninth embodiment shown in FIG. 11 has a resistor 55 connected between the diodes 53 and 45 (impedance elements) of the eighth embodiment.

According to the seventh to ninth embodiments, when a surge voltage of negative polarity is applied to the input terminal 1, the same effect as the second, fourth and fifth embodiments can be provided.

Tenth Embodiment

Figure 12:
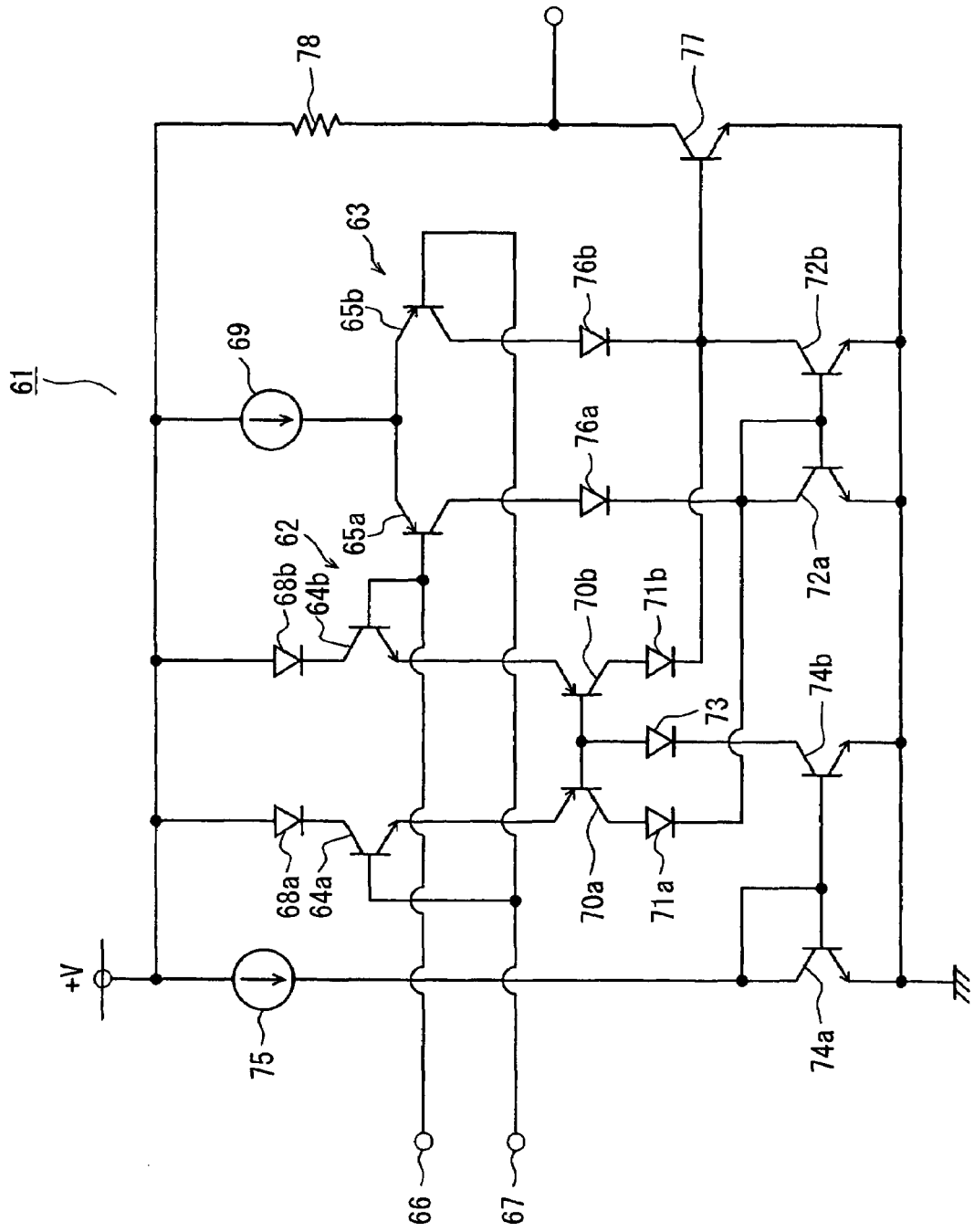
FIG. 12 is a circuit diagram showing an internal construction of a comparator in a tenth embodiment of the present invention.

In a tenth embodiment shown in FIG. 12, when the comparator shown in FIG. 13 is provided as an internal circuit of a semiconductor integrated circuit, surge protection is provided within the comparator.

As shown in FIG. 12, a comparator 61 includes two differential couples 62 and 63 in an input stage. The differential couple 62 comprises NPN transistors 64a and 64b, and the differential couple 63 comprises PNP transistors 65a and 65b. An input terminal 66 of the comparator 61 is connected to the bases of transistors 64b and 65a. An input terminal 67 is connected to the bases of the transistors 64a and 65b.

Diodes 68a and 68b are connected between a power supply +V and the collectors of the transistors 64a and 64b, and a common current source 69 is connected between the power supply +V and the collectors of the transistors 65a and 65b. The emitters of the transistors 64a and 64b are connected to the emitters of PNP transistors 70a and 70b the bases of which are connected in common. The collectors of the transistors 70a and 70b are respectively connected to the collectors of NPN transistors 72a and 72b that are mirror-coupled, via diodes 71a and 71b. The emitters of the transistor 72a and 72b are connected to the ground, and their bases are connected in common to the collector of the transistor 72a.

The bases of the transistors 70a and 70b are connected to the collector of the NPN transistor 74b via a diode 73. The NPN transistors 74a and 74b form a pair of mirrors, their emitters are connected to the ground, and their bases are connected in common to the collector of the transistor 74a. A current source 75 is connected between the collector and the power supply.

The collectors of the transistors 65a and 65b are connected to the collectors of the transistors 72a and 72b respectively via diodes 76a and 76b. The collector of the transistor 72b is connected to the base of an NPN transistor 77 provided in an output stage. The collector of the transistor 77 is connected to the power supply via a resistor 78 and functions as an output terminal of the comparator 61, and its emitter is connected to the ground. The diodes 68, 71, 73 and 76 are reverse flow preventing elements.

That is, the comparator 61 includes two differential couples 62 and 63 constructed of the different conductive transistors 64 and 65 in the input stage, and thereby can cover an in-phase input voltage range from the ground level to the power supply level.

It is assumed that a surge voltage of positive polarity is applied to the input terminals 66 and 67 of the comparator 61. At this time, a surge current that is to flow from the input terminals 66 and 67 to the power supply via the collector of the transistor 62 is blocked by the diodes 68a and 68b.

On the other hand, it is assumed that a surge voltage of negative polarity is applied to the input terminals 66 and 67. A surge current that is to flow from the ground to the input terminals 66 and 67 via the transistors 72 and 63 is blocked by diodes 73a and 76b. In this case, a surge current that is to pass through the transistor 70 is blocked by the diodes 71 and 73.

The comparator 61 normally operates with a reference voltage for comparison being applied to the input terminal 67. Even when the reference voltage is higher than the power supply voltage, the diode 68a prevents reverse flow of a current to the power supply +V. Therefore, also in this instance, comparison operation can be normally performed.

According to the tenth embodiment, since the diodes 68, 71, 73 and 76 are provided within the comparator 61, when a surge voltage is applied to the input terminals 66 and 67, a current that is to flow backward to the power supply or the ground via the inside of the comparator 61 can be blocked. The input stage of the comparator 61 is constructed with two differential couples 62 and 63 comprising transistors 62 and 63 of different conductivity from each other, and the diodes 68a, 68b and 76a, 76b are respectively connected between the collector (power supply terminal) of the transistor 62 and the power supply, and between the collector (ground terminal) of the transistor 63 and the ground. Therefore, by combining the differential couples 62 and 63, an in-phase input voltage range of the comparator 61 is not narrowed even when the diodes are connected in different parts. Therefore, the in-phase input voltage range can be expanded to above the power supply voltage and below the ground level.

In the first to the tenth embodiments, various modifications may be made. For example, the first to fifth embodiments may be combined with the sixth to tenth embodiments. The internal circuit (transistor 5) may be a PNP transistor. The internal circuit in the sixth to ninth embodiments may be a MOSFET like the third embodiment. In the cases of the fourth, fifth, eighth and ninth embodiments, the diodes 4 and 45 may be replaced with a resistor (impedance element). That is, in this case, the diodes 30 and 53 function to prevent reverse flow of a current. A voltage generating element and a voltage clamp element may be constructed of a resistor. A comparator as an internal circuit is not limited to that of the tenth embodiment. Only one differential couple may construct an input stage, or plural couples may be connected in series.

Eleventh Embodiment

Figure 14:
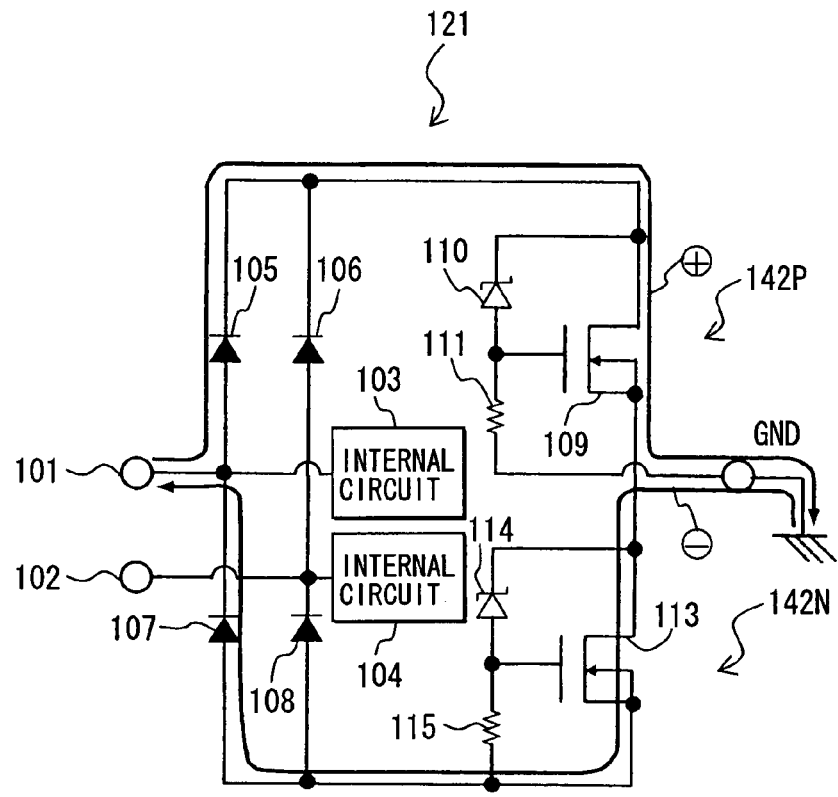
FIG. 14 is a circuit diagram showing an input protection circuit of an eleventh embodiment of the present invention.
Figure 15:
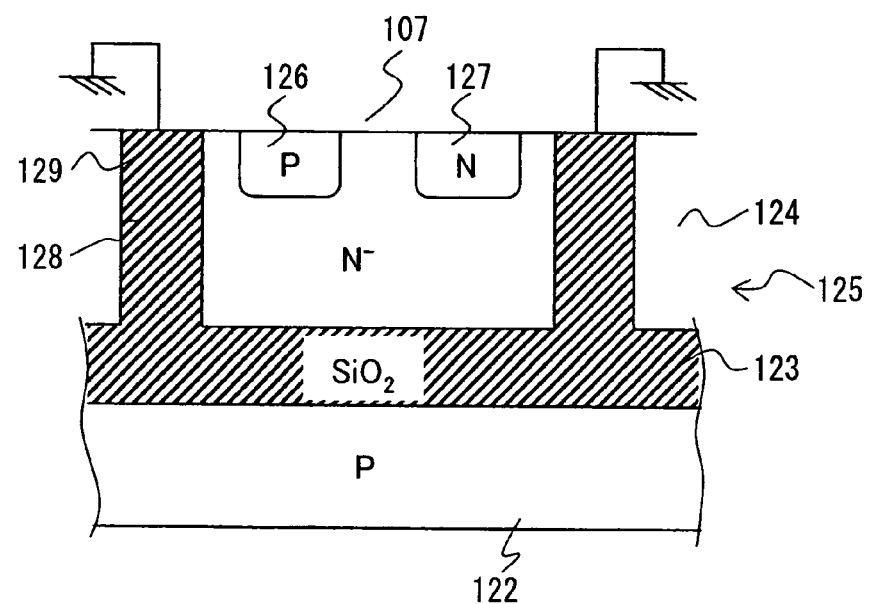
FIG. 15 is a sectional view showing a diode in a semiconductor integrated circuit.
Figure 23:
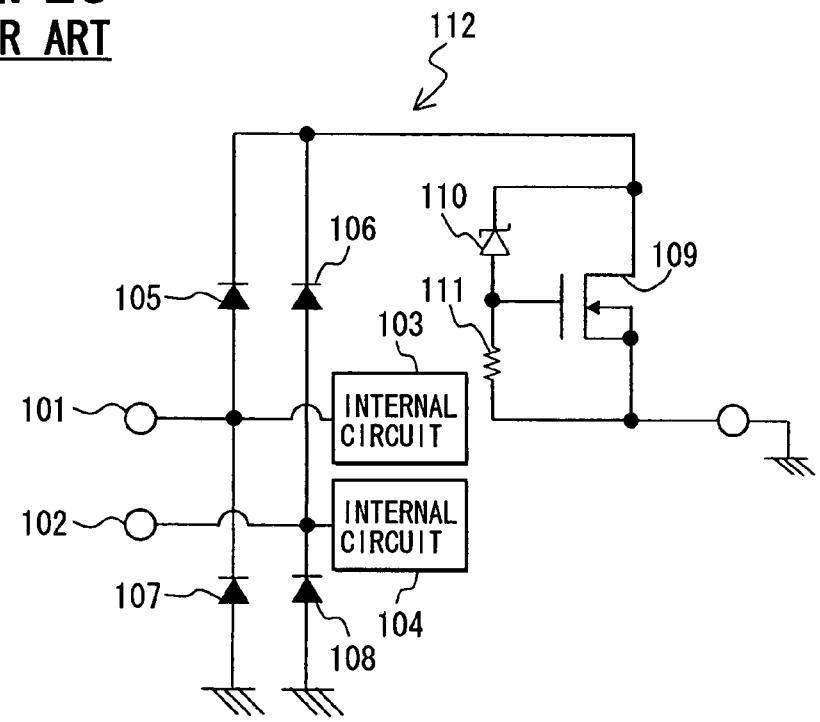
FIG. 23 is a circuit diagram showing a further conventional input protection circuit.

In an eleventh embodiment shown in FIGS. 14 and 15, an input protection circuit 121 is integrated into an IC mounted in a vehicle. In the input protection circuit 121, circuits shown in FIG. 23 are formed in a trench-isolated region on an SOI (silicon-on-insulator) by an insulating film material.

FIG. 15 shows a structure in the vicinity of a diode 107 (second diode) in a schematic section of a semiconductor substrate. A $SiO_2$ film 123 is formed as an isolation layer on a P-type silicon substrate 122 as a supporting substrate, and an N⁻ silicon layer 124 is formed on the $SiO_2$ film 123. These layers construct an SOI substrate 125. A P-type region 126 and a N-type region 127 are formed on a surface layer part of the SOI substrate 125. Thus the diode 107 is constructed.

The diode 107 is electrically isolated (insulated) from other circuit elements by a trench element isolation structure. In the trench element isolation structure, first, narrow trenches 128 are extended to the $SiO_2$ film 123 through the N⁻ silicon layer 124 in the circumference of the diode 107. Next, its inside is oxidized to be covered with a $SiO_2$ film (insulating material) (not shown), and polysilicon 129 (insulating material) and the like are filled in the trenches 128. The diode 107 is thus formed. Since the $SiO_2$ films 123 and 129 separating elements, and the elements and the P-type silicon substrate 122 are good insulators, leak currents flowing through them are trivial.

In FIG. 14, Zener voltages of the Zener diodes 110 and 114 (first and second bias circuits) are set to about 60V to 70V. A set of FET 109 (first transistor), Zener diode 110 (first bias circuit), and resistor 111 (first bias circuit) forms a clamping circuit 142P (first clamping circuit). A set of FET 113, Zener diode 114 and resistor 115 forms a clamping circuit 142N (second clamping circuit).

The input protection circuit 121 operates, when a surge voltage of positive polarity is applied, in the same manner as the input protection circuit 112 shown in FIG. 23. On the other hand, when a surge voltage of negative polarity such as field decay that occurs in electronic circuits mounted in the vehicle is applied to the input terminal 101, the Zener diode 114 becomes conductive and a voltage is developed across the resistor 115 (second bias circuit). Then, since the FET 113 (second transistor) turns on, a current path from the circuit ground to the input terminal 101 via the FET 113 and the diode 107 is formed, and a surge current flows. At this time, since the surge voltage is clamped by a Zener voltage of the Zener diode 114 and a terminal voltage of the resistor 115, the internal circuit 103 is protected.

According to this embodiment, since the circuit elements of the input protection circuit 121 are formed in regions formed on the SOI substrate 125 by trench isolation, a parasitic transistor is not formed unlike the case of the formation by the PN junction isolation, and the formation region of each element is surely insulated.

When a surge voltage of negative polarity is applied to the input terminal 101, since the Zener diode 114 of the clamping circuit 142N becomes conductive and the FET 113 is turned on, a current path from the circuit ground to the input terminal 101 is formed and the internal circuit 103 can be protected. Therefore, the entire input protection circuit 121 can be easily integrated into an IC, and costs can be reduced without increasing the circuit size. Moreover, during clamp operation, a relatively large surge current can be allowed to flow via the FET 113.

Twelfth Embodiment

Figure 16:
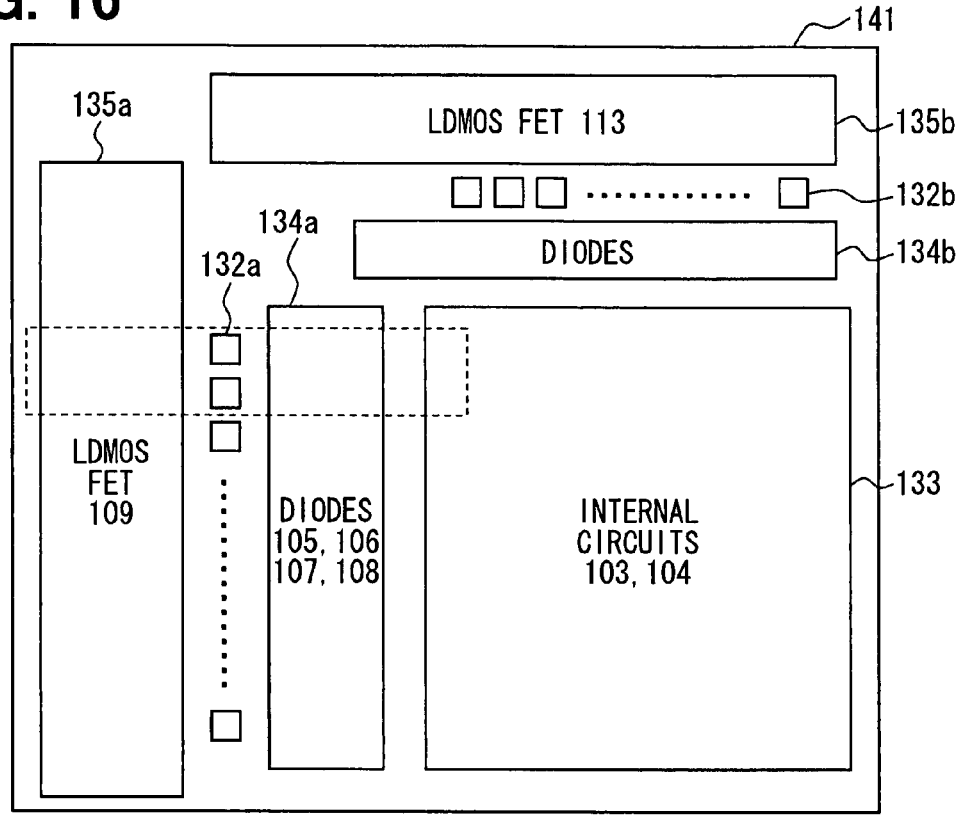
FIG. 16 is a schematic view showing arrangement of circuit elements when an input protection circuit is integrated into an IC, in a twelfth embodiment of the present invention.
Figure 17:
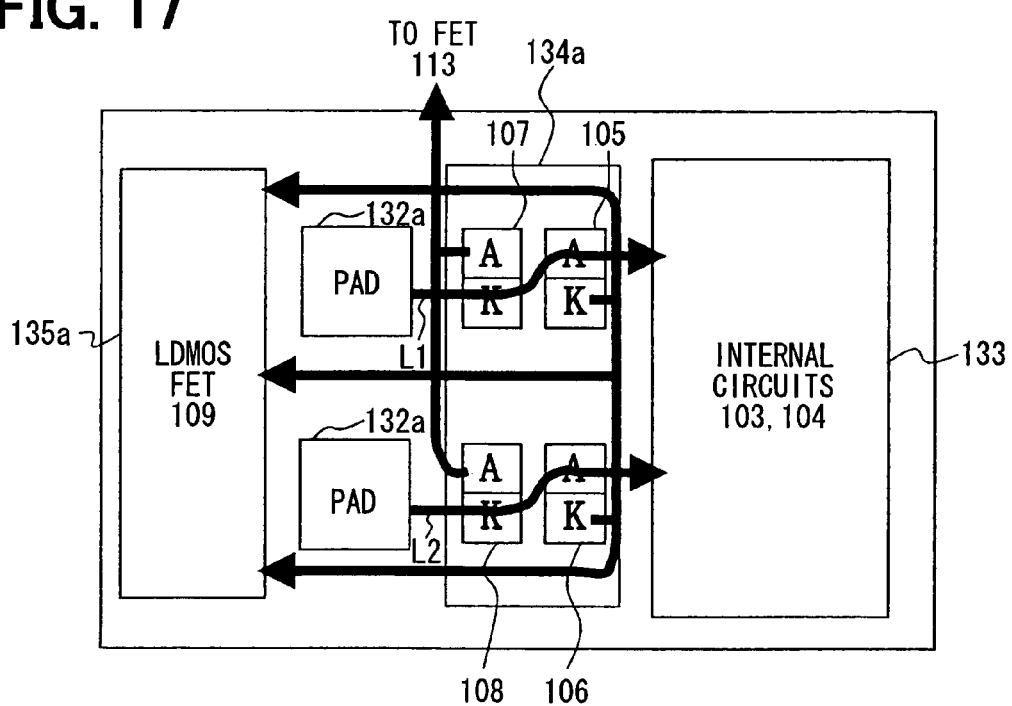
FIG. 17 is a schematic view showing only a corresponding portion of FIG. 14 in the arrangement of FIG. 16.

In a twelfth embodiment shown in FIGS. 16 and 17, a part of the input protection circuit 121 to be integrated into an IC is arranged as shown. The integration of the input protection circuit 121 into an IC based on a conventional circuit arrangement is shown in FIGS. 18 and 19.

Figure 18:
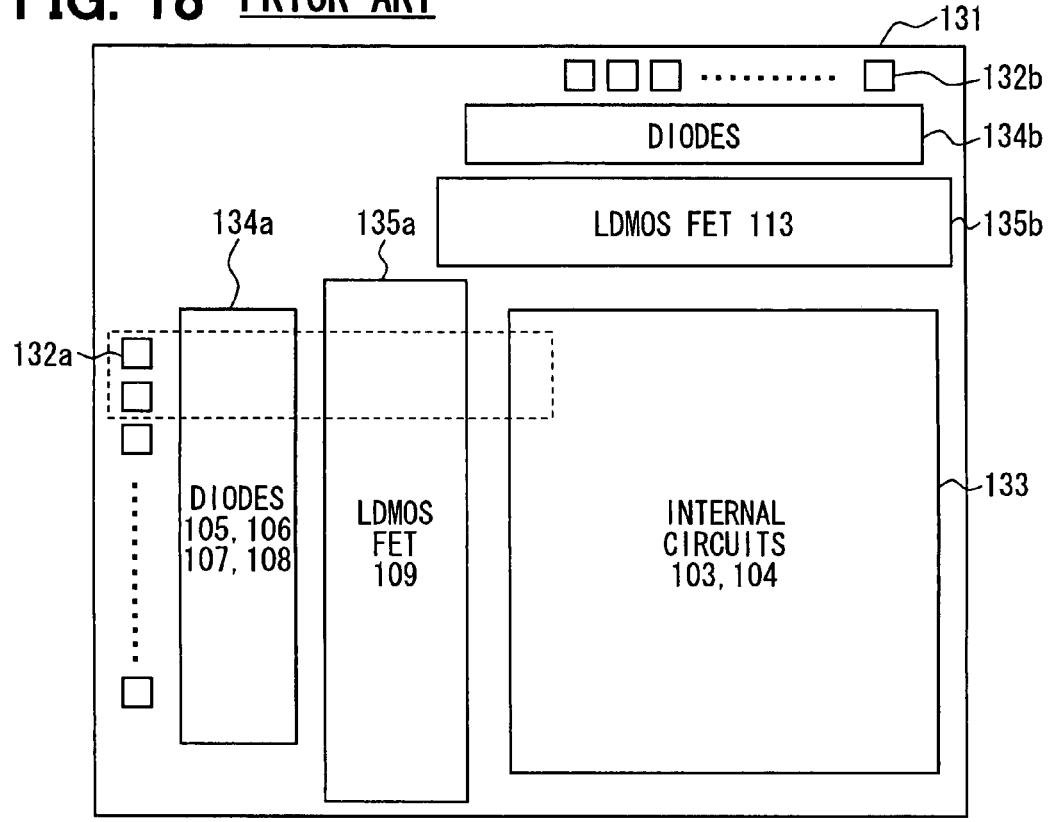
FIG. 18 is a schematic view showing conventional arrangement of circuit elements of an input protection circuit.
Figure 19:
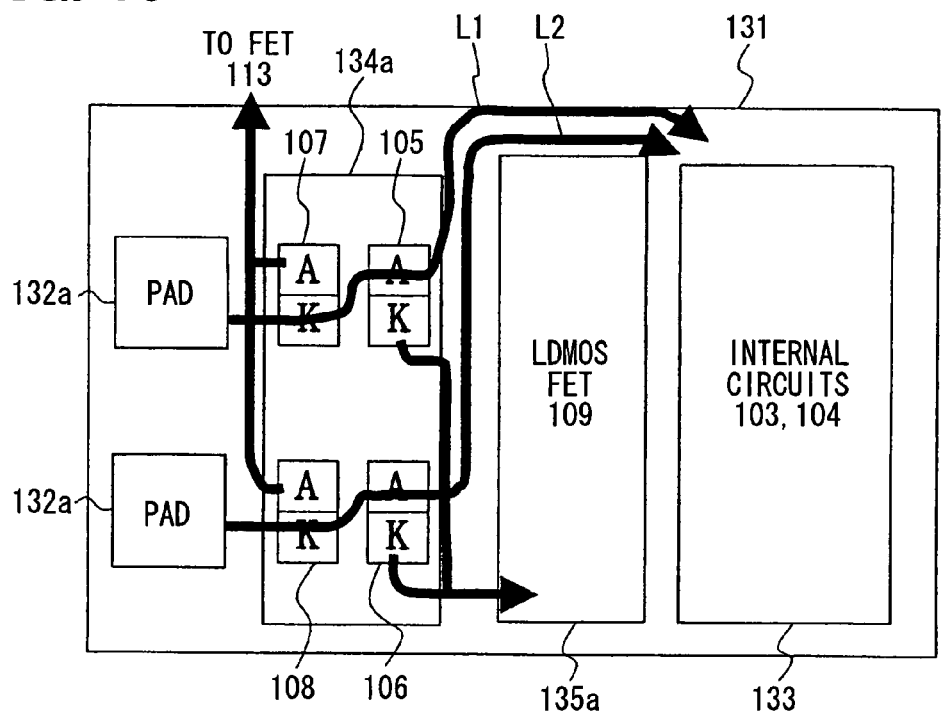
FIG. 19 is a schematic view showing only a corresponding portion of the input protection circuit in the arrangement of FIG. 18.

In an IC chip 131 shown in FIGS. 18 and 19, pads 132a and 132b corresponding to the input terminals 101 and 102 are disposed in the outermost circumferential portions (the left side and the top side in the figure, respectively) of the chip 131 to perform wire bonding, and an internal circuit region 133 is disposed inside them. Wiring used for an absorption path of a surge current should be preferably as thick and short as possible. Therefore, between the pad 132a and the left side of the internal circuit region 133, a formation region 134a of diodes 105 to 107 and a formation region 135a such as FET 109 for absorbing positive surge are juxtaposed. On the other hand, between the pad 132b and the top side of the internal circuit region 133, a diode formation region 134b and a formation region 135b such as FET 113 for absorbing negative surge are disposed.

FIG. 19 shows the arrangement of FIG. 18 only in corresponding portions of FIG. 14, i.e., area indicated with broken line rectangle in FIG. 18. After wirings L1 and L2 extending from the pad 132a are connected to diodes 105 to 108 within the diode formation region 134a, they must be connected to the internal circuit region 133 beyond the FET formation region 135a. Although the wiring layer can be sufficiently provided, the freedom of wiring is limited. Therefore, if the wirings L1 and L2 cannot directly straddle over the FET formation region 135a, they must be routed so that they bypass the region 135a. That is, in this case, the chip size must be increased because a space for the wirings L1 and L2 is additionally reserved. Since the same is also true for another pad 132, as the number of input terminals increases, the size of the IC chip 131 increases.

In the IC chip 141, as shown in FIG. 16, the FET formation regions 135a and 135b are disposed in the outermost circumferential portions, and between the internal circuit region 133 and them, the pads 132 and the diode formation regions 134 are disposed. When such a disposition is adopted as shown in FIG. 17, wirings L1, for instance, extending from the pad 132a of the input terminal 101 can be directly connected to the internal circuit region 133 (internal circuit 103) via the diode formation region 134a (diodes 105, 107).

In this case, although the distance between the diode formation region 134a and the FET formation region 135a becomes larger, wirings L1, L2 between the both can be made through the space of the pad 132a. Although the space of the pad 132a is narrow, as shown in FIG. 17, by pluralizing wirings with common connection points of the diodes, current resistance can be maintained. Wire bonding between the pads 132a and leads (not shown in the figure) may be made over the FET formation region 135a.

According to the twelfth embodiment, since the FETs 109 and 113 are disposed in the outermost circumferential regions in the IC chip 141, wiring connection among the input terminals 101 and 102, the diodes 105 to 108 and the internal circuits 103 and 104 becomes simple, and wirings among the FETs 109 and 113 and the diodes 105 to 107 can be made through the space of the pad 132 corresponding to each input terminal. As a result, the entire wiring becomes easy and an increase in chip size can be reduced.

Thirteenth Embodiment

Figure 20:
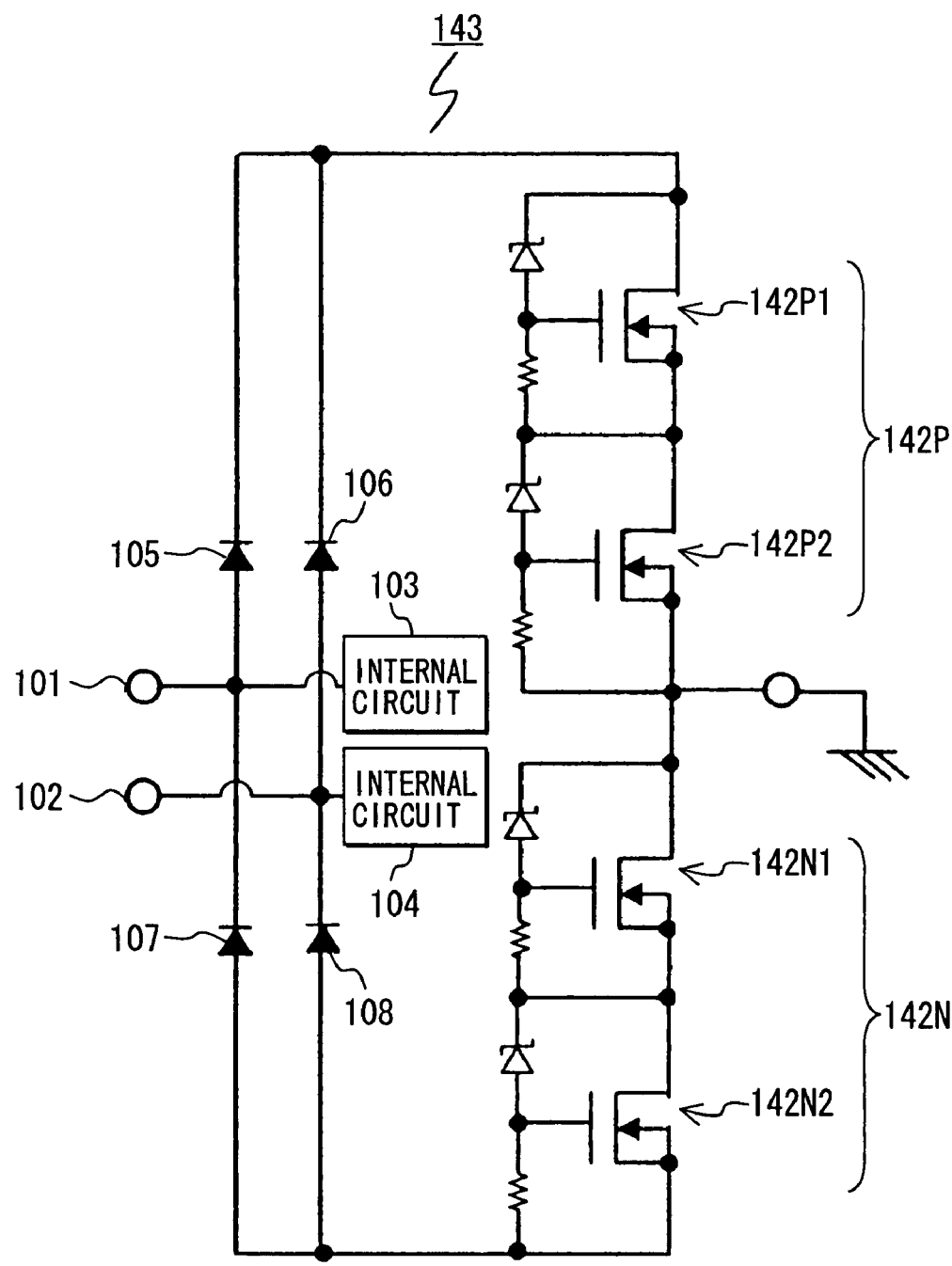
FIG. 20 is a circuit diagram showing an input protection circuit according to a thirteenth embodiment of the present invention.

In a thirteenth embodiment shown in FIG. 20, an input protection circuit 143 has two clamping circuits 142P (142P1, 142P2) and 142N (142N1, 142N2). Those clamping circuits are connected in series in two stages. This input protection circuit 143 can also meet application of higher levels of surge voltage.

Fourteenth Embodiment

Figure 21:
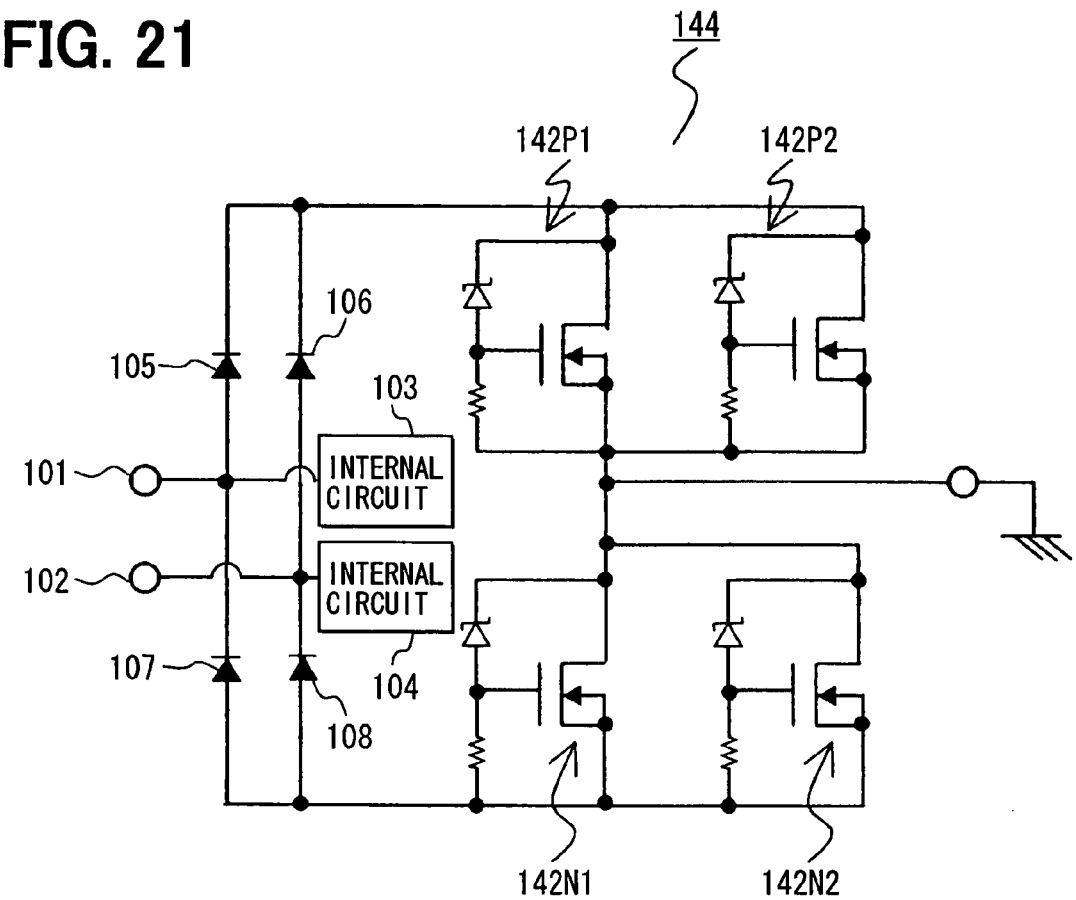
FIG. 21 is a circuit diagram showing an input protection circuit according to a fourteenth embodiment of the present invention.

In a fourteenth embodiment shown in FIG. 21, an input protection circuit 144 has two clamping circuits 142P (142P1, 142P2) and 142N (142N1, 142N2). Those clamping circuits are connected in parallel in two stages. According to the fourteenth embodiment, current resistance can be increased and a larger current can be allowed to flow when a surge voltage is applied.

Fifteenth Embodiment

Figure 22:
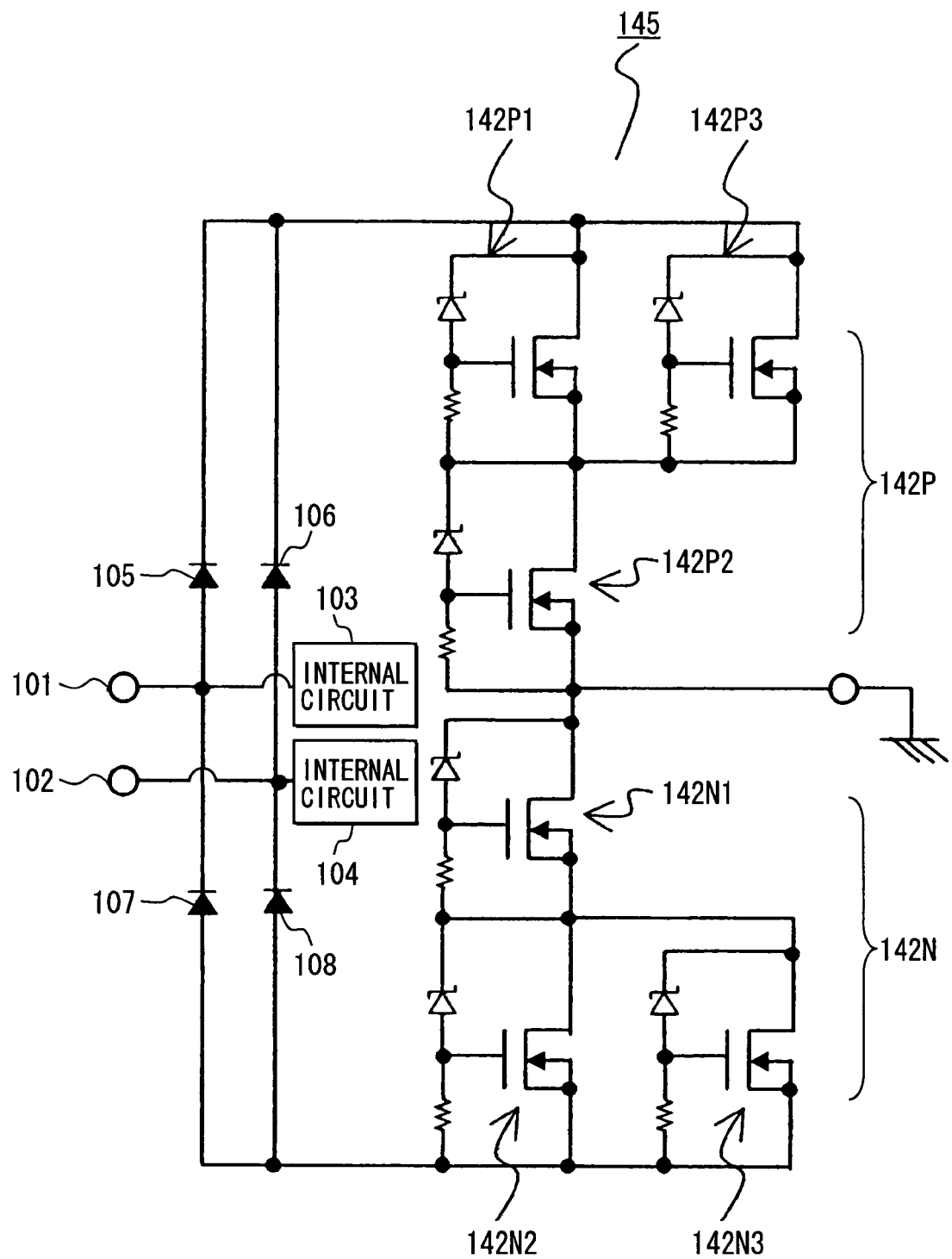
FIG. 22 is a circuit diagram showing an input protection circuit according to a fifteenth embodiment of the present invention.
Figure 24:
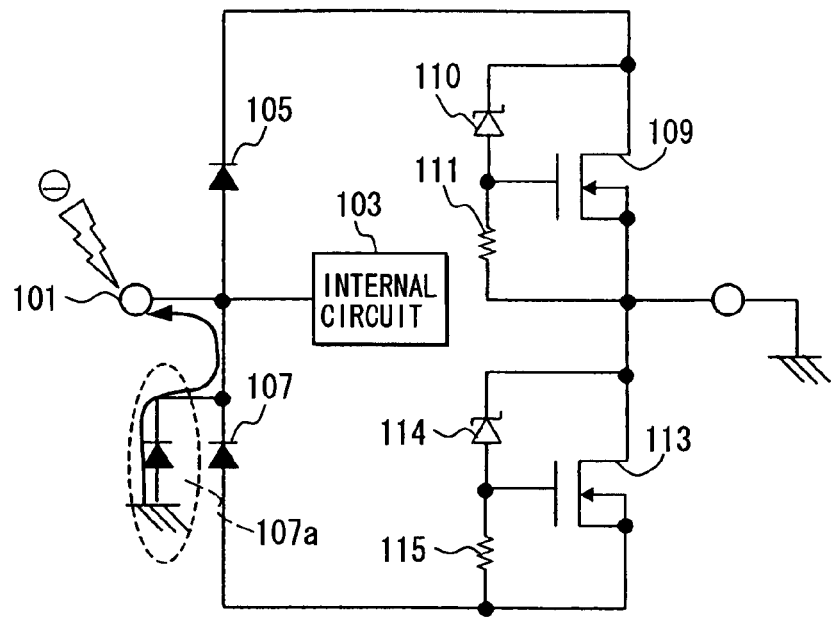
FIG. 24 is a circuit diagram showing a modification of the conventional input protection circuit shown in FIG. 23 to meet a surge voltage of negative polarity.
Figure 25:
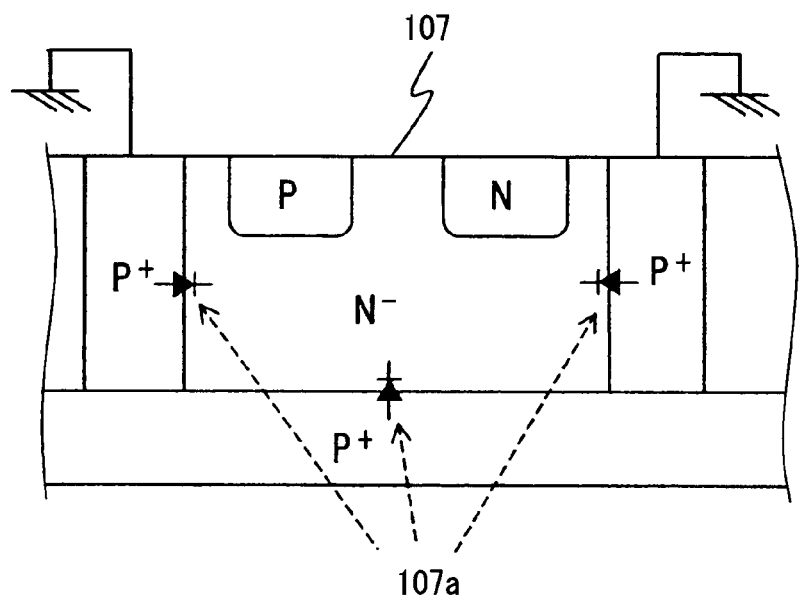
FIG. 25 is a sectional view showing a diode in a semiconductor integrated circuit.

In a fifteenth embodiment shown in FIG. 22, an input protection circuit 145 corresponds to a combination of the thirteenth embodiment and the fourteenth embodiment. The clamping circuits 142P (142P1. 142P2, 142P3) and 142N (142N1, 142N2, 142N3) are connected in series. In the clamping circuit 142P, clamping circuits 142P1 and 142P2 are connected in series and a clamping circuit 142P3 is connected to the claiming circuit 142P1. In the clamping circuit 142N, clamping circuits 142N1 and 142N2 are connected in series and a clamping circuit 142N3 is connected to the claiming circuit 142N1. The clamping circuit 142P is provided at the side of the diodes 105 and 106, and the clamping circuit 142N is provided at the side of the diodes 107 and 108. The fifteenth embodiment thus provides the similar advantages of the thirteenth and the fourteenth embodiments.

In the eleventh to the fifteenth embodiments, various modifications may be made. For instance, as a transistor forming a clamping circuit, a P-channel MOSFET may be used in place of an N-channel MOSFET In this case, the connection position of a Zener diode and a resistor that form a bias circuit may be reversed. An NPN transistor may alternatively be used in place of the N-channel MOSFET of the clamping circuit. Furthermore, the clamping circuit may be formed with only a Zener diode. The number of connection circuit stages of each clamping circuit 142P, 142N of the thirteenth to fifteenth embodiments may be three or more. The protection circuits may be widely applied without being limited to electronic circuits mounted in a vehicle.

What is claimed is:

1. An input protection circuit comprising:
    a reverse flow preventing element connected between an input terminal that receives a signal from an outside and an internal circuit;
    a series circuit connected between the input terminal and a ground and including a voltage generating element that develops a voltage thereacross when conductive and a voltage clamp element that clamps the voltage when a surge voltage is applied to the input terminal; and
    a current path forming element that forms a current path between a first common connection point of the reverse flow preventing element and the internal circuit and a second common connection point of the series circuit, and sets a potential at the first common connection point to be less than a potential at the input terminal when the surge voltage is applied to the input terminal.

2. The input protection circuit according to claim 1, wherein the current path forming element includes a transistor.

3. The input protection circuit according to claim 1, wherein the current path forming element includes a diode.

4. The input protection circuit according to claim 1, wherein the voltage clamp element includes a Zener diode.

5. The input protection circuit according to claim 1, wherein the voltage generating element includes a diode.

6. The input protection circuit according to claim 1, wherein the voltage generating element includes a Zener diode.

7. The input protection circuit according to claim 1, wherein the internal circuit includes a comparator that is internally provided with a reverse flow preventing element that prevents reverse flow of a current to a power supply or the ground from an input terminal thereof via its inside when the surge voltage is applied to the input terminal.

8. The input protection circuit according to claim 7, wherein:
    the comparator includes an input stage having two differential couples connected in parallel, each differential couple having transistors of different conductivity from each other; and
    the reverse flow preventing element is connected between a power supply terminal of one couple and a ground terminal of another couple with respect to the transistors constructing the two differential couples.

9. An input protection circuit comprising:
    an impedance element connected between an input terminal that receives a signal from an outside and an internal circuit;
    a series circuit connected between the input terminal and a ground and including a voltage generating element that develops a voltage thereacross when conductive and a voltage clamp element that clamps the voltage when a surge voltage is applied to the input terminal; and
    a current path forming element that forms a unidirectional current path between a first common connection point of the impedance element and the internal circuit and a second common connection point of the series circuit, and sets a potential at the first common connection point to be less than a potential at the input terminal when the surge voltage is applied to the input terminal.

10. The input protection circuit according to claim 9, further comprising:
    a resistor connected between the impedance element and the current path forming element.

11. The input protection circuit according to claim 9, wherein the voltage clamp element includes a Zener diode.

12. The input protection circuit according to claim 9, wherein the voltage generating element includes a diode.

13. The input protection circuit according to claim 9, wherein the voltage generating element includes a Zener diode.

14. The input protection circuit according to claim 9, wherein the internal circuit includes a comparator that is internally provided with a reverse flow preventing element that prevents reverse flow of a current to a power supply or the ground from an input terminal thereof via its inside when the surge voltage is applied to the input terminal.

15. The input protection circuit according to claim 14, wherein:
the comparator includes an input stage having two differential couples connected in parallel, each differential couple having transistors of different conductivity from each other; and
the reverse flow preventing element is connected between a power supply terminal of one couple and a ground terminal of another couple with respect to the transistors constructing the two differential couples.

16. An input protection circuit comprising:
a first diode having an anode and a cathode, the anode being connected to an input terminal that transmits a signal received from an outside to an internal circuit;
a second diode having an anode and a cathode, the cathode being connected to the input terminal;
a first clamping circuit connected between the cathode of the first diode and a circuit ground; and
a second clamping circuit connected between the anode of the second diode and the circuit ground,
wherein each of the first diode, the second diode, the first clamping circuit, and the second clamping circuit is formed within a region mutually insulated from adjacent formation regions of other circuit elements.

17. The input protection circuit according to claim 16, wherein the second diode is formed within the region that is trench-isolated by an insulating film on a silicon-on-insulator substrate.

18. The input protection circuit according to claim 16, wherein:
the first clamping circuit includes a first transistor connected between the cathode of the first diode and the circuit ground, and a first bias circuit disposed on an input side of the first transistor to supply a bias to turn on the first transistor when a surge voltage of positive polarity is received at the input terminal; and
the second clamping circuit includes a second transistor connected between the anode of the second diode and the circuit ground, and a second bias circuit disposed on an input side of the second transistor to supply a bias to turn on the second transistor when a surge voltage of negative polarity is received at the input terminal.

19. An input protection circuit comprising:
a first diode having an anode and a cathode, the anode being connected to an input terminal that transmits a signal received from an outside to an internal circuit;
a second diode having an anode and a cathode, the cathode being connected to the input terminal;
a first clamping circuit connected between the cathode of the first diode and a circuit ground; and
a second clamping circuit connected between the anode of the second diode and the circuit ground, wherein
each of the first diode, the second diode, the first clamping circuit, and the second clamping circuit is formed within a region mutually insulated from adjacent formation regions of other circuit elements,
the first clamping circuit includes a first transistor connected between the cathode of the first diode and the circuit ground, and a first bias circuit disposed on an input side of the first transistor to supply a bias to turn on the first transistor when a surge voltage of positive polarity is received at the input terminal,
the second clamping circuit includes a second transistor connected between the anode of the second diode and the circuit ground, and a second bias circuit disposed on an input side of the second transistor to supply a bias to turn on the second transistor when a surge voltage of negative polarity is received at the input terminal, and
the first and second transistors are disposed in an outermost circumferential region on a semiconductor substrate.

20. An input protection circuit comprising:
a first diode having an anode and a cathode, the anode being connected to an input terminal that transmits a signal received from an outside to an internal circuit;
a second diode having an anode and a cathode, the cathode being connected to the input terminal;
a first clamping circuit connected between the cathode of the first diode and a circuit ground; and
a second clamping circuit connected between the anode of the second diode and the circuit ground, wherein
each of the first and second clamping circuits includes a plurality of same clamp circuits connected in series or a plurality of same clamp circuits connected in parallel, and
each of the first diode, the second diode, the first clamping circuit, and the second clamping circuit is formed within a region mutually insulated from adjacent formation regions of other circuit elements.

21. The input protection circuit according to claim 16, wherein each of the first diode, the second diode, the first clamping circuit, and the second clamping circuit is formed on a single silicon-on-insulator substrate and is separated from one another by trenches filled with insulating material.

* * * * *